(12) United States Patent
Kamiya et al.

(10) Patent No.: US 9,847,433 B2
(45) Date of Patent: Dec. 19, 2017

(54) INTEGRATED MOS VARICAP, AND VOLTAGE CONTROLLED OSCILLATOR AND FILTER HAVING SAME

(71) Applicant: Interchip Corporation, Shiroi-shi (JP)

(72) Inventors: Masaaki Kamiya, Shiroi (JP); Ryuji Ariyoshi, Shiroi (JP)

(73) Assignee: Interchip Corporation, Chiba (JP)

( * ) Notice: Subject to any disclaimer, the term of this patent is extended or adjusted under 35 U.S.C. 154(b) by 0 days.

(21) Appl. No.: 15/314,712

(22) PCT Filed: May 11, 2015

(86) PCT No.: PCT/JP2015/063513
§ 371 (c)(1),
(2) Date: Nov. 29, 2016

(87) PCT Pub. No.: WO2015/182363
PCT Pub. Date: Dec. 3, 2015

(65) Prior Publication Data
US 2017/0200834 A1  Jul. 13, 2017

(30) Foreign Application Priority Data

May 30, 2014  (JP) ................. 2014-113482

(51) Int. Cl.
*H01L 29/93*  (2006.01)
*H01L 27/08*  (2006.01)
(Continued)

(52) U.S. Cl.
CPC .......... *H01L 29/93* (2013.01); *H01L 27/0808* (2013.01); *H03B 5/366* (2013.01); *H03H 11/04* (2013.01); *H03B 2201/0208* (2013.01)

(58) Field of Classification Search
CPC ..... H01L 29/93; H01L 29/66; H01L 27/0808; H01L 27/0811; H03B 5/366; H03H 11/04
See application file for complete search history.

(56) References Cited

U.S. PATENT DOCUMENTS

2001/0000414 A1* 4/2001 Fukayama .......... H01L 27/0811
257/596
2003/0067026 A1* 4/2003 Bulucea .............. H01L 27/0808
257/303
(Continued)

FOREIGN PATENT DOCUMENTS

JP  57-097787 A  6/1982
JP  09-027732 A  1/1997
(Continued)

*Primary Examiner* — Phuc Dang
(74) *Attorney, Agent, or Firm* — The Webb Law Firm

(57) ABSTRACT

Each of varicaps 50A to 50C configured to be connected in parallel is an MOS capacitor III produced under a common and single process condition. Each of the varicaps 50A to 50C has a conductor layer serving as a second electrode and formed via a capacitance insulating film on a first conductivity-type semiconductor substrate serving as a first electrode, and a second conductivity-type impurity region formed near a surface in proximity to a region of the first conductivity-type semiconductor substrate opposing the conductor layer. Each of the varicaps 50A to 50C is configured such that a capacitance value as a capacitance element between the first conductivity-type semiconductor substrate serving as the first electrode and the conductor layer serving as the second electrode is changed by applying a control voltage to the conductor layer while applying any one of a plurality of types of direct-current voltages having different voltages to the second conductivity-type impurity region.

18 Claims, 7 Drawing Sheets

(51) Int. Cl.
*H03B 5/36* (2006.01)
*H03H 11/04* (2006.01)

(56) References Cited

U.S. PATENT DOCUMENTS

| | | | |
|---|---|---|---|
| 2004/0263269 A1* | 12/2004 | Takamatsu | H01L 27/0808 331/108 C |
| 2012/0256520 A1* | 10/2012 | Torashima | H01L 41/0815 310/300 |

FOREIGN PATENT DOCUMENTS

| | | |
|---|---|---|
| JP | 09-307356 A | 11/1997 |
| JP | 10-051238 A | 2/1998 |
| JP | 2000-252480 A | 9/2000 |
| JP | 2001-210788 A | 8/2001 |
| JP | 2004-235577 A | 8/2004 |
| JP | 2005-123426 A | 5/2005 |
| JP | 2007-158766 A | 6/2007 |

\* cited by examiner

US 9,847,433 B2

INTEGRATED MOS VARICAP, AND VOLTAGE CONTROLLED OSCILLATOR AND FILTER HAVING SAME

CROSS-REFERENCE TO RELATED APPLICATIONS

This application is the United States national phase of International Application No. PCT/JP2015/063513 filed May 11, 2015, and claims priority to Japanese Patent Application No. 2014-113482 filed May 30, 2014, the disclosures of which are hereby incorporated in their entirety by reference.

TECHNICAL FIELD

This invention relates to an integrated MOS varicap, and a voltage controlled oscillator and a filter which have the integrated MOS varicap; in particular, those useful when applied to a varicap having a plurality of types of characteristics, and electronic equipment having this varicap applied thereto.

BACKGROUND ART

FIG. 7 is a circuit diagram showing an oscillator having an MOS capacitor shown in JP-A-2000-252480. The oscillator shown in the drawing is a voltage controlled oscillator (may hereinafter be referred to as VCO II) whose oscillation frequency can be controlled by a control voltage $V_c$. This type of VCO II has external connection terminals 121, 122 for connection of a crystal resonator 110 to be connected externally. The VCO II also has a CMOS inverter 123, and the CMOS inverter 123 is integral with a bias resistor $R_f$ 126 connected between an input-side terminal 124 and an output-side terminal 125 thereof to constitute an amplifier circuit. Between the output-side terminal 125, serving as the output terminal of the amplifier circuit of the VCO II, and the external connection terminal 122, a resistor $R_d$ 127 is connected. A capacitor $C_d$ 128 is connected to the external connection terminal 122, and an adjusting external additional capacitor $C_o$ 115 (not required if unnecessary) is connected by external mounting to a $C_o$ capacitor connection terminal 129 provided between the external connection terminal 122 and the capacitor $C_d$ 128.

To the external connection terminal 121, a capacitor $C_g$ 131, a varicap 50 as an MOS variable capacitance element, and a resistor $R_1$ 133 are connected via a capacitor $C_p$ 130 which shuts off a direct-current voltage. A control voltage $V_c$ is applied to the other end of the resistor $R_1$ 133.

The resistor $R_d$ 127, the crystal resonator 110, the capacitor $C_d$ 128, the adjusting external additional capacitor $C_o$ 115, the capacitor $C_g$ 131, the varicap 50, and the capacitor $C_p$ 130 form a resonance circuit, and such a resonance circuit is driven by the amplifier circuit composed of the CMOS inverter 123 and the bias resistor $R_f$ 126.

The crystal resonator 110 connected to the output side of the amplifier circuit has an opposite-side terminal connected to the external connection terminal 121, and an output from the above-mentioned resonance circuit is provided as feedback to the input-side terminal 124 of the amplifier circuit from the external connection terminal 121.

The control voltage $V_c$ is applied to the varicap 50 via the resistor $R_1$ 133 to change the capacitance of the varicap 50 in response to the direct-current voltage value of the control voltage $V_c$.

With the VCO II configured as above, an oscillation frequency $f_0$ is determined by a combined capacitance formed by the capacitor $C_d$ 128, adjusting external additional capacitor $C_o$ 115, capacitor $C_g$ 131, varicap 50 and direct-current shut-off capacitor $C_p$ 130 which constitute the resonance circuit. Thus, the capacitance of the varicap 50 is changed by the voltage of the control voltage $V_c$, whereby the oscillation frequency $f_0$ can be controlled to an arbitrary value.

The varicap 50 disclosed in JP-A-2000-252480 is designed to have a wide capacitance variable range (i.e., a large capacitance variable width), so that a wide frequency variable range (i.e., a large frequency variable width) can be ensured for the VCO II having the varicap 50 applied thereto. In summary, the structure of an MOS capacitor having a gate electrode formed on a $P^-$ type semiconductor substrate via an insulating film, for example, is configured such that an $N^+$ type impurity region is formed in the vicinity of a region of the $P^-$ type semiconductor substrate opposing the gate electrode, and a direct-current voltage can be applied to the $N^+$ type impurity region via a contact hole, although details of the structure will be described later. By applying the DC voltage to the $N^+$ type impurity region, it is attempted to prevent a strong inversion layer from being formed in the region of the $P^-$ type semiconductor substrate opposing the gate electrode, thereby avoiding the saturation of variable capacitance characteristics. As a result, the variable capacitance range of the varicap 50 can be widened by the voltage applied to the $N^+$ type impurity region.

SUMMARY OF THE INVENTION

Problems to be Solved by the Invention

As described above, a wide variable capacitance range can be ensured using the varicap 50 disclosed in JP-A-2000-252480. When the varicap 50 is applied to the VCO II, therefore, a great variable frequency region can be secured.

Even when the varicap 50 can be prepared, with its variable capacitance characteristics being designed as predetermined, however, the frequency characteristics of the VCO II are changed, if the physical properties of the crystal resonator 110 (e.g., circuit parameters in an equivalent circuit, electrode size, etc.) are different. That is, linearity in the frequency characteristics of the VCO II may change according to the characteristics of the crystal resonator 110. In such a case, matching of capacitance characteristics conformed to characteristics varying for each VCO applied becomes necessary.

On the other hand, conditions for obtaining a desired linearity, for example, are different between a case where the varicap is applied to VCO II for changing the frequency in a relatively low frequency (e.g., 20 MHz) band and a case where the varicap is applied to VCO II for changing the frequency in a relatively high frequency (e.g., 155 MHz) band. Thus, it has been sometimes difficult to provide a varicap having universal characteristics in a range from a low frequency band to a high frequency band.

In order to obtain necessary oscillation frequency characteristics in the conventional VCO II, it is necessary to change the characteristics of the varicap, which is an MOS capacitor, as appropriate, in accordance with the conditions of application. Such a change in the characteristics requires that the process conditions (for example, conditions for ion implantation into the channel) for the varicap, which is the MOS capacitor, be changed depending on use for a low frequency band or use for a high frequency band, and production be performed individually. Such an individual change in the process conditions necessarily involves a tiresome operation complicating the manufacturing process, and pushes up costs accordingly.

The present invention has been accomplished in light of the above conventional technologies. It is an object of the invention to provide an integrated MOS varicap which, even when produced under a common and single process condition, flexibly accommodates various applications and uses and can realize the desired characteristics of electronic devices to which the integrated MOS varicap is applied; and a voltage controlled oscillator and a filter which have the integrated MOS varicap.

Summary of the Invention

A first aspect of the present invention for attaining the above object is an integrated MOS varicap which is a varicap assemblage composed of a plurality of varicaps connected in parallel, wherein each of the varicaps is an MOS capacitor produced under a common and single process condition; each of the varicaps has a conductor layer serving as a second electrode and formed via a capacitance insulating film on a first conductivity-type semiconductor substrate serving as a first electrode, and a second conductivity-type impurity region formed near a surface in proximity to a region of the first conductivity-type semiconductor substrate opposing the conductor layer; and each of the varicaps is configured such that a capacitance value as a capacitance element between the first conductivity-type semiconductor substrate serving as the first electrode and the conductor layer serving as the second electrode is changed by applying a control voltage to the conductor layer while applying any one of a plurality of types of direct-current voltages, which serve as reverse voltages of a diode composed of the first conductivity-type semiconductor substrate and the second conductivity-type impurity region and which have different voltages, to the second conductivity-type impurity region.

According to the present aspect, the capacitance characteristics between the first electrode and the second electrode responsive to the control voltage can be changed, with the direct-current voltage applied to the second conductivity-type impurity region being used as a parameter. Thus, the plurality of types of varicaps having a plurality of types of capacitance/control voltage characteristics conformed to the type of the direct-current voltage can be easily formed using the MOS capacitor prepared under the common and single process condition.

Consequently, an integrated MOS varicap having desired capacitance characteristics can be provided easily and inexpensively by freely combining the varicaps having a plurality of types of capacitance/control voltage characteristics.

A second aspect of the present invention is an integrated MOS varicap which is a varicap assemblage composed of a plurality of varicaps connected in parallel, wherein each of the varicaps is an MOS capacitor produced under a common and single process condition; each of the varicaps has a conductor layer serving as a second electrode and formed via a capacitance insulating film on a first conductivity-type semiconductor substrate serving as a first electrode, a second conductivity-type impurity region formed near a surface in proximity to a region of the first conductivity-type semiconductor substrate opposing the conductor layer, and a first conductivity-type high concentration layer formed near a surface only in the region opposing the conductor layer so as to be fully covered with the conductor layer on the first conductivity-type semiconductor substrate; and each of the varicaps is configured such that a capacitance value as a capacitance element between the first conductivity-type semiconductor substrate serving as the first electrode and the conductor layer serving as the second electrode is changed by applying a control voltage to the conductor layer while applying any one of a plurality of types of direct-current voltages, which serve as reverse voltages of a diode composed of the first conductivity-type semiconductor substrate and the second conductivity-type impurity region and which have different voltages, to the second conductivity-type impurity region.

According to the present aspect, each varicap has the first conductivity-type high concentration layer. Thus, MOS varicaps having a wider variable capacitance range than those of the first aspect can be obtained. Consequently, the same actions and effects as those in the first aspect can be rendered further remarkable.

A third aspect of the present invention is the integrated MOS varicap according to the first or second aspect, wherein each of the varicaps is composed of a plurality of unit varicaps which are connected in parallel, and to each of which a direct-current voltage identical with the direct-current voltage is applied, and wiring connected to each of the unit varicaps is changed, as appropriate, whereby arbitrary capacitance characteristics responsive to the control voltage are imparted to each of the unit varicaps.

According to the present embodiment, a combination of varicaps different in capacitance characteristics can be easily formed by a changeover in wiring, for example, using a switching means.

A fourth aspect of the present invention is the integrated MOS varicap according to the third aspect, wherein the arbitrary capacitance characteristics responsive to the control voltage are imparted by selectively cutting a fuse connected to each of the unit varicaps to make a change in the wiring.

According to the present embodiment, a combination of varicaps different in capacitance characteristics can be easily formed by melting the fuse, for example, using laser light.

A fifth aspect of the present invention is a voltage controlled oscillator having the integrated MOS varicap according to any one of the first to fourth aspects as a variable capacitance element defining an oscillation frequency.

According to the present embodiment, optimization of oscillation frequency characteristics ascribed to a variable capacitance element can be realized easily and unerringly using an integrated MOS varicap comprising a combination of varicaps different in capacitance/control voltage characteristics. Moreover, capacitance adjustment for obtaining desired oscillation frequency characteristics, for example, because of a difference in the characteristics of a crystal resonator of a voltage controlled oscillator can be accomplished easily and unerringly.

A sixth aspect of the present invention is a filter having the integrated MOS varicap according to any one of the first to fourth aspects as a variable capacitance element defining a cut-off frequency.

According to the present embodiment, the optimization of the cut-off frequency characteristics of a filter can be performed easily and unerringly.

Effects of the Invention

According to the present invention, the characteristics of each varicap, which is an element of an integrated MOS varicap and which has been formed under a common and single process condition, can be easily changed using the direct-current voltage applied to the second conductivity-type impurity region formed near a surface in proximity to the region of the first conductivity-type semiconductor substrate opposing the conductor layer. Consequently, an integrated MOS varicap having arbitrary capacitance characteristics can be produced at a low cost and with ease by combining, as appropriate, a plurality of types of the varicaps having different direct-current voltages.

Hence, the adjustment of the characteristics of an electronic device composed of a combination of the integrated MOS varicaps, for example, the adjustment of the oscillation frequency characteristics in VCO, can be made easily and appropriately.

MODE FOR CARRYING OUT THE INVENTION

An embodiment of the present invention will be described in detail based on the accompanying drawings.

Figure 1:
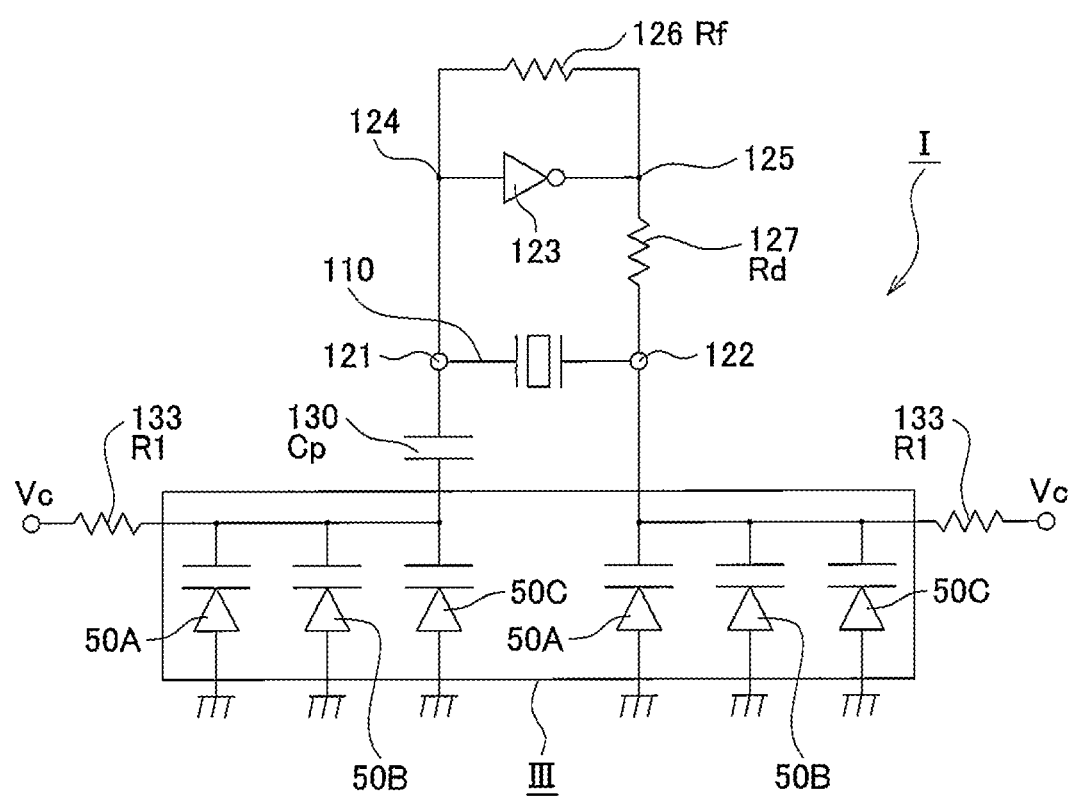
FIG. 1 is a circuit diagram of VCO incorporating an integrated MOS varicap according to an embodiment of the present invention.
Figure 7:
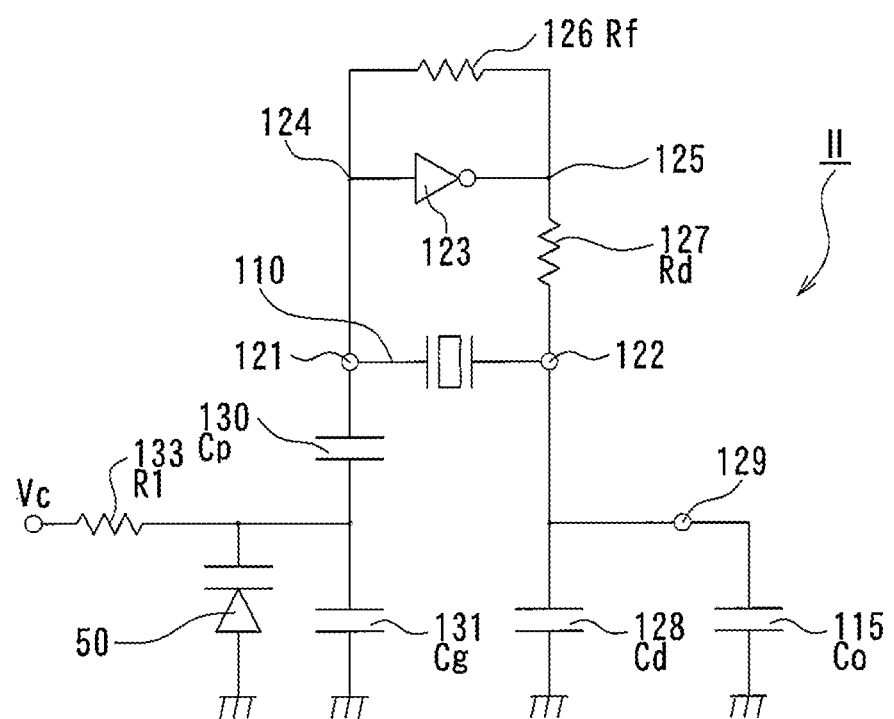
FIG. 7 is a circuit diagram showing VCO II incorporating an MOS capacitor shown in prior art (JP-A-2000-252480).

FIG. 1 is a circuit diagram of VCO I incorporating an integrated MOS varicap III according to an embodiment of the present invention. In the present embodiment, as shown in the drawing, the VCO I has the same configuration as that of the VCO II shown in FIG. 7, except for the section of the integrated MOS varicap III, and except that capacitors $C_p$ 130 for cutting off a direct-current voltage are connected not only to an external connection terminal 121, but also to an external connection terminal 122. Thus, the same parts as in FIG. 7 are assigned the same numerals as in FIG. 7, and duplicate explanations are omitted.

As shown in FIG. 1, the integrated MOS varicap III has a plurality of (3 in the present embodiment) varicaps, 50A, 50B, 50C, connected in parallel, and 2 sets of the varicaps 50A, 50B, 50C are arranged laterally symmetrically in the drawing (a total of 6 varicaps, 50A, 50B, 50C on the left side and 50A, 50B, 50C on the right side). These varicaps 50A, 50B, 50C are produced under a common and single process condition. However, any one of 3 types of direct-current voltages (to be described in detail later) is applied to an N+ type impurity region (will be described in detail later) of each of the varicaps 50A, 50B, 50C, and three different types of capacitance/control voltage characteristics are imparted, with the applied direct-current voltage as a parameter. If classified by the capacitance/control voltage characteristics, the first type of the varicap is the varicap 50A (will be hereinafter referred to as the first type), the second type of the varicap is the varicap 50B (hereinafter, the second type), and the third type of the varicap is the varicap 50C (hereinafter, the third type).

Figure 2:
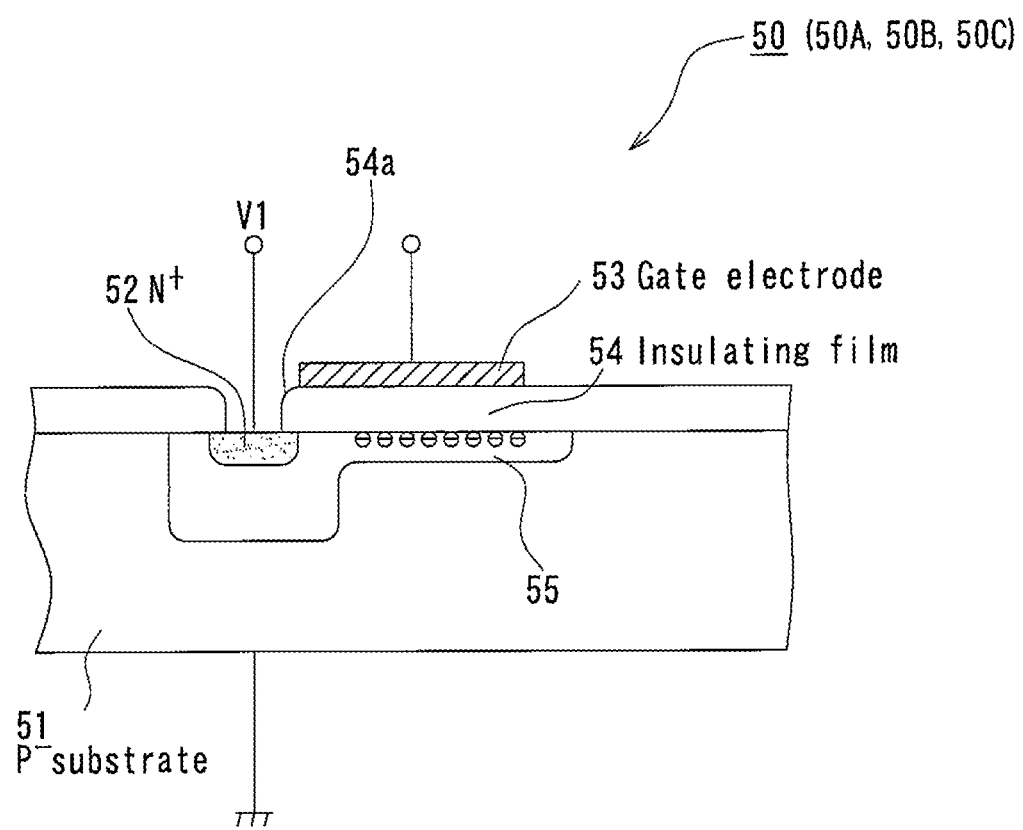
FIG. 2 is a schematic sectional view showing the structure of an MOS capacitor constituting a varicap in the present embodiment.

FIG. 2 is a schematic sectional view showing the structure of an MOS capacitor constituting the above three types of varicaps, 50A, 50B and 50C (since the varicaps 50A to 50C are elements of the same configuration prepared under the common and single process condition, they are generically expressed as varicaps 50). As shown in the drawing, a P⁻ type semiconductor substrate 51 is provided with a gate electrode 53, which has been formed from polysilicon constituting the MOS capacitor, via an insulating film 54. In proximity to a region of the P⁻ type semiconductor substrate 51 opposing the gate electrode 53, an N+ type impurity region 52 is formed. In a region of the insulating film 54 opposing the N+ type impurity region 52, a contact hole 54a is formed so that a direct-current voltage V can be applied to the N+ type impurity region 52.

In the varicap 50, the N+ type impurity region 52 is provided close to the region opposing the gate electrode 53, as mentioned above, and a direct-current voltage V1 serving as a reverse voltage of a diode composed of the P⁻ type semiconductor substrate 51 and the N+ type impurity region 52 is applied to the N+ type impurity region 52. As a result, minority carriers gathering in the surface of the substrate are absorbed to the N+ type impurity region 52 biased in the reverse direction, and a strong inversion state minimally occurs. That is, thanks to the N+ type impurity region 52 biased reversely, the thickness of a depletion layer grows, without saturating, in response to an increase in the voltage applied to the gate electrode 53. Consequently, a large variable width of the capacitance value C can be ensured. Incidentally, the capacitance value C of the varicap 50 is the series combined capacitance of the capacitance value $C_0$ of the insulating film 54 and the capacitance value of a depletion layer 55. Therefore, the combined capacitance value decreases with an increase in the control voltage $V_c$ applied to the gate electrode 53.

Figure 3:
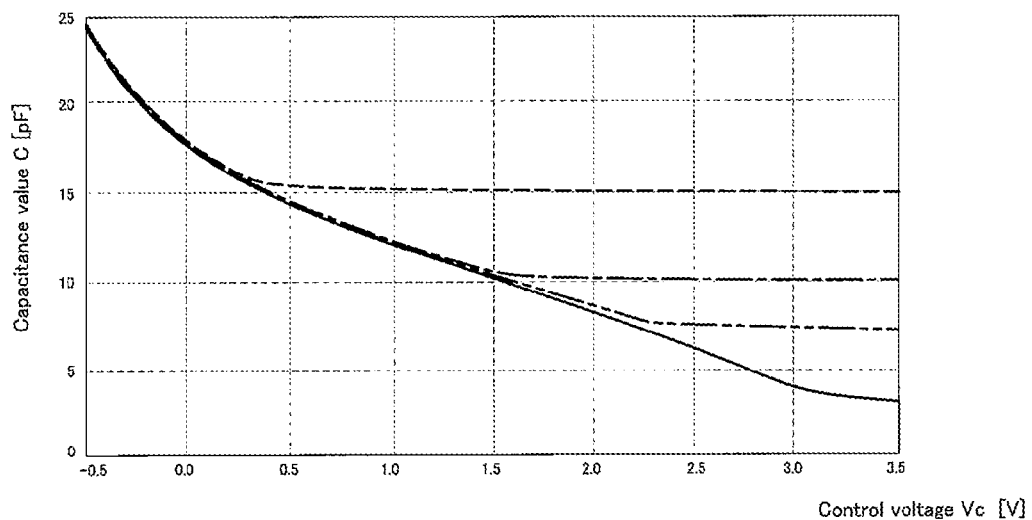
FIG. 3 is a characteristic diagram showing the relationship between the capacitance value C of the varicap and a control voltage $V_c$, with a direct-current voltage V1 as a parameter.

FIG. 3 is a characteristic diagram showing the relationship between the capacitance value C of the varicap 50 and the control voltage $V_c$, with the direct-current voltage V1 as a parameter. In the drawing, a dashed line represents the characteristics at a direct-current voltage V1=GND potential, a dashed dotted line represents the characteristics at V1=1.0 [V], a dashed double-dotted line represents the characteristics at V1=1.65 [V], and a solid line represents the characteristics at V1=3.3 [V]. Reference to this drawing shows that the higher the direct-current voltage V1, the greater the control voltage $V_c$ at which the capacitance value C is saturated becomes, and the wider the variable capacitance region becomes accordingly.

Figure 4:
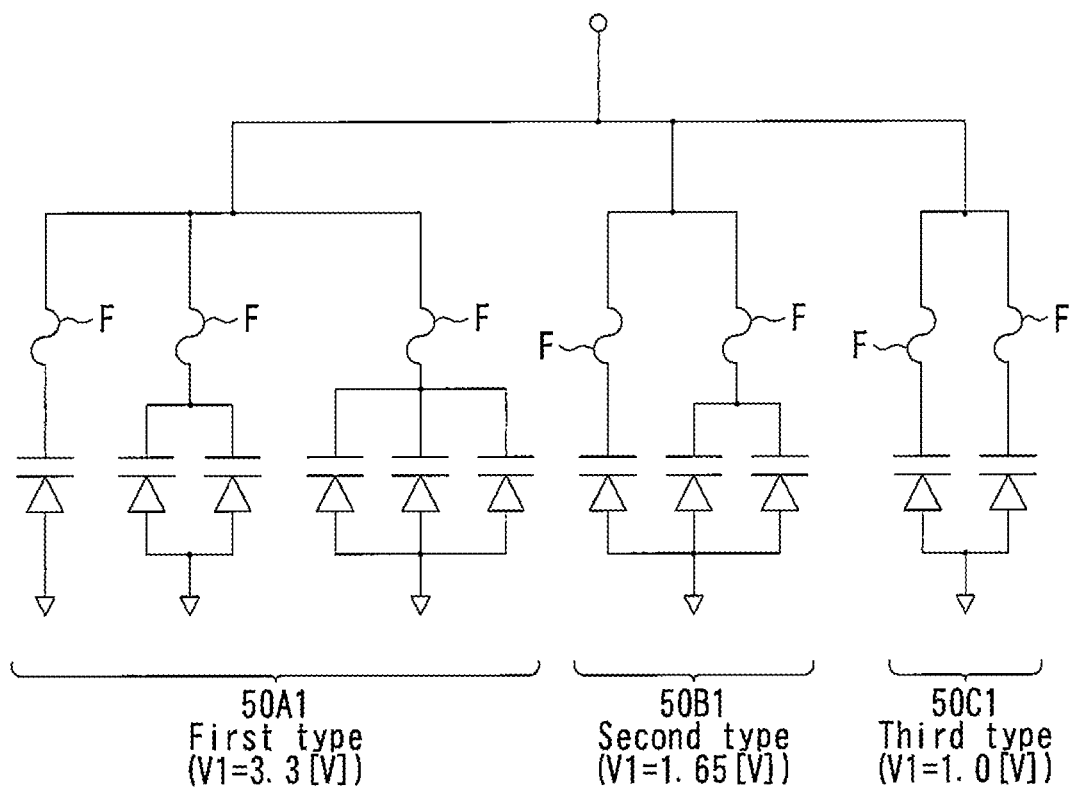
FIG. 4 is a circuit diagram showing an example of connection of the varicaps, each as an assemblage of unit varicaps, classified by type.

The varicaps 50A to 50C, the first to third types of varicap 50 in the present embodiment, are each constituted as an assemblage of a plurality of unit varicaps 50A1, 50B1, 50C1. That is, as shown in FIG. 4, a plurality of the unit varicaps 50A1s, 50B1s, 50C1s, which constitute the first to third types of varicaps, respectively, are connected in parallel in such a manner as to be classified by group to which the same direct-current voltage V1 is applied. In the present embodiment, the direct-current voltage V1 for the first group is 3.3 [V], the direct-current voltage V1 for the second group is 1.65 [V], and the direct-current voltage V1 for the third group is 1.0 [V]. Thus, each unit varicap 50A1, 50B1 or 50C1 has the corresponding capacitance value/control voltage characteristics shown in FIG. 3. Furthermore, the unit varicaps 50A1, 50B1, 50C1 can constitute an MOS capacitor of any combined capacitance value imparting arbitrary characteristics, by selectively cutting a fuse F connected halfway through the wiring leading to each element.

The direct-current voltage V1 of varying type can be obtained suitably from a power supply voltage $V_{cc}$, or by dividing the power supply voltage $V_{cc}$ appropriately with the use of a voltage-dividing resistor. On this occasion, it is possible, without doubt, to utilize a reference voltage $V_{ref}$ of a power supply circuit, which stably outputs a more accurate voltage value than the power supply voltage $V_{cc}$, or a voltage resulting from the division of the reference voltage $V_{ref}$. Utilization of the reference voltage $V_{ref}$ is more preferred, because it stabilizes the direct-current voltage V1, and can thus stabilize the characteristics of the unit varicaps 50A1, 50B1, 50C1 as well.

Figure 5:
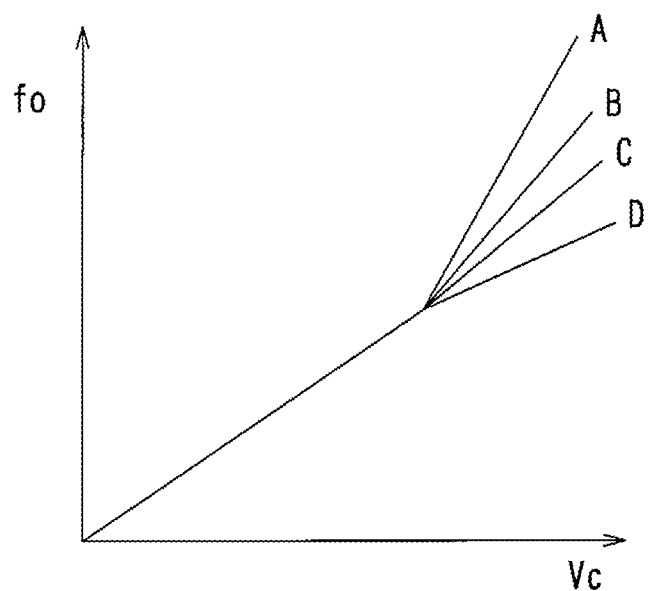
FIG. 5 is a characteristic diagram showing the characteristics of oscillation frequency ($f_0$) of VCO I according to the present embodiment in response to the control voltage $V_c$.

As for the oscillation frequency of VCO I, on the other hand, as the control voltage $V_c$ increases, namely, as the capacitance value C decreases, an oscillation frequency $F_0$ rises, as shown in FIG. 5. When the varicap 50 in the present embodiment having a great variable capacitance range is applied, a VCO I having a correspondingly great oscillation frequency range can be constructed. Besides, a plurality of types of varicaps 50 with different values of the direct-current voltage V1 are combined, as appropriate, whereby oscillation frequency characteristics ensuring a desired linearity, for example, as indicated by the characteristics C can be obtained, even if variations in the characteristics of the crystal resonator 110 or the like of the VCO I occur. The characteristics C are characteristics upon relative increases in the numbers of the second and third types as compared with the first type, while the characteristics D are obtained by increasing the number of the third types further. The characteristics A are obtained, for example, by forming all of the varicaps from the first type, whereas the characteristics B are obtained by forming some of the varicaps from the second or third type.

Figure 6:
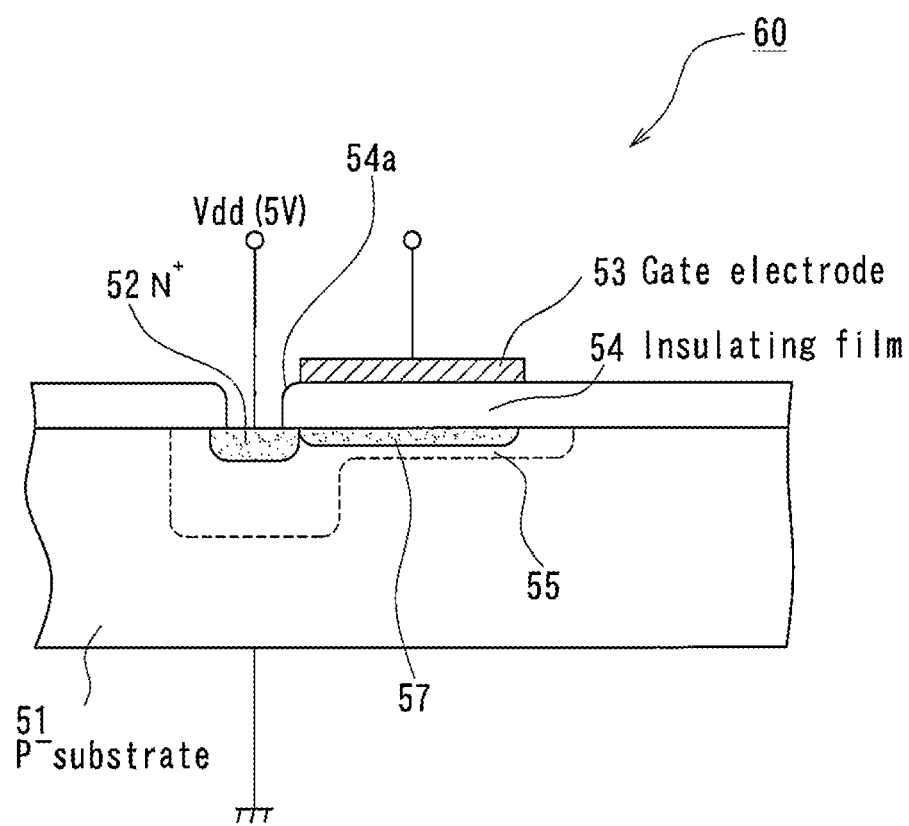
FIG. 6 is a schematic sectional view showing the structure of an MOS capacitor constituting a varicap in another embodiment.

In the VCO I in general use, the control voltage $V_c$ is unipolar, and a voltage of, say, 0 V to +3 V or to +4V is used, but a negative voltage is not used, as the control voltage. In order to secure a large variable width of capacitance within this positive voltage range, therefore, it suffices to increase the capacitance when the control voltage is 0 V. This increase in the capacitance may be achieved by producing a varicap configured such that a dense P type layer is formed near the surface of the P⁻ type semiconductor substrate 51 by means of ion implantation or the like, so that the thickness of the depletion layer when the voltage at the gate electrode 53 is 0 V or less can be kept small. That is, as shown in FIG. 6, a P+ type layer 57 is provided in a region of a varicap 60 opposing a gate electrode 53, whereby the thickness of the depletion layer when the gate electrode 53 is at 0 V or less can be kept down to a small value, and the capacitance at a control voltage $V_c$ of 0 V is rendered high. With such a varicap 60, the variable width of the capacitance value C can be made greater than in the varicap 50. That is, according to the present embodiment, the varicap 60 has a first conductivity-type high concentration layer, and thus can be configured as an MOS varicap having an even wider variable capacitance range than in the first embodiment. Consequently, the same actions and effects as those in the first embodiment can be rendered further remarkable.

In the foregoing embodiments, the MOS capacitor of the present invention formed on the P⁻ substrate has been described. Such an MOS capacitor, however, can be prepared on a P well. It goes without saying, moreover, that an impurity region of a type opposite to that in the above embodiments is formed on an N substrate or an N well, whereby an MOS capacitor having an electrically opposite polarity can be produced.

The aforementioned embodiments have been described in connection with the application of the integrated MOS varicap III to VCO, but this is not limitative. For example, the integrated MOS varicap III can be applied to a variable capacitance element and a filter which define a cut-off frequency. In this case, the cut-off frequency characteristics of the filter can be optimized easily and unerringly.

The present invention can be effectively used in industrial fields concerned with the manufacture and sale of electronic devices utilizing variable capacitance.

The invention claimed is:

1. An integrated MOS varicap which is a varicap assemblage composed of a plurality of varicaps connected in parallel, wherein
    each of the varicaps is an MOS capacitor produced under a common and single process condition;
    each of the varicaps has
    a conductor layer serving as a second electrode and formed via a capacitance insulating film on a first conductivity-type semiconductor substrate serving as a first electrode, and
    a second conductivity-type impurity region formed near a surface in proximity to a region of the first conductivity-type semiconductor substrate opposing the conductor layer; and
    each of the varicaps is configured such that a capacitance value as a capacitance element between the first conductivity-type semiconductor substrate serving as the first electrode and the conductor layer serving as the second electrode is changed by applying a control voltage to the conductor layer while applying any one of a plurality of types of direct-current voltages, which serve as reverse voltages of a diode composed of the first conductivity-type semiconductor substrate and the second conductivity-type impurity region and which have different voltages, to the second conductivity-type impurity region.

2. The integrated MOS varicap according to claim 1, wherein
    each of the varicaps is composed of a plurality of unit varicaps which are connected in parallel, and to each of which a direct-current voltage identical with the direct-current voltage is applied, and
    wiring connected to each of the unit varicaps is changed, as appropriate, whereby arbitrary capacitance characteristics responsive to the control voltage are imparted to each of the unit varicaps.

3. A voltage controlled oscillator, comprising the integrated MOS varicap according to claim 2 as a variable capacitance element defining an oscillation frequency.

4. A filter, comprising the integrated MOS varicap according to claim 2 as a variable capacitance element defining a cut-off frequency.

5. A voltage controlled oscillator having the integrated MOS varicap according to claim 3 as a variable capacitance element defining an oscillation frequency.

6. A voltage controlled oscillator, comprising the integrated MOS varicap according to claim 5 as a variable capacitance element defining an oscillation frequency.

7. A filter, comprising the integrated MOS varicap according to claim 5 as a variable capacitance element defining a cut-off frequency.

8. A voltage controlled oscillator, comprising the integrated MOS varicap according to claim 1 as a variable capacitance element defining an oscillation frequency.

9. A filter, comprising the integrated MOS varicap according to claim 1 as a variable capacitance element defining a cut-off frequency.

10. An integrated MOS varicap which is a varicap assemblage composed of a plurality of varicaps connected in parallel, wherein
   each of the varicaps is an MOS capacitor produced under a common and single process condition;
   each of the varicaps has
      a conductor layer serving as a second electrode and formed via a capacitance insulating film on a first conductivity-type semiconductor substrate serving as a first electrode,
      a second conductivity-type impurity region formed near a surface in proximity to a region of the first conductivity-type semiconductor substrate opposing the conductor layer, and
      a first conductivity-type high concentration layer formed near a surface only in the region opposing the conductor layer so as to be fully covered with the conductor layer on the first conductivity-type semiconductor substrate; and
   each of the varicaps is configured such that a capacitance value as a capacitance element between the first conductivity-type semiconductor substrate serving as the first electrode and the conductor layer serving as the second electrode is changed by applying a control voltage to the conductor layer while applying any one of a plurality of types of direct-current voltages, which serve as reverse voltages of a diode composed of the first conductivity-type semiconductor substrate and the second conductivity-type impurity region and which have different voltages, to the second conductivity-type impurity region.

11. The integrated MOS varicap according to claim 10, wherein the arbitrary capacitance characteristics responsive to the control voltage are imparted by selectively cutting a fuse connected to each of the unit varicaps to make a change in the wiring.

12. A voltage controlled oscillator, comprising the integrated MOS varicap according to claim 11 as a variable capacitance element defining an oscillation frequency.

13. A filter, comprising the integrated MOS varicap according to claim 11 as a variable capacitance element defining a cut-off frequency.

14. A filter having the integrated MOS varicap according to claim 11 as a variable capacitance element defining a cut-off frequency.

15. A voltage controlled oscillator, comprising the integrated MOS varicap according to claim 14 as a variable capacitance element defining an oscillation frequency.

16. A filter, comprising the integrated MOS varicap according to claim 14 as a variable capacitance element defining a cut-off frequency.

17. A voltage controlled oscillator, comprising the integrated MOS varicap according to claim 10 as a variable capacitance element defining an oscillation frequency.

18. A filter, comprising the integrated MOS varicap according to claim 10 as a variable capacitance element defining a cut-off frequency.

* * * * *

UNITED STATES PATENT AND TRADEMARK OFFICE
CERTIFICATE OF CORRECTION

PATENT NO. : 9,847,433 B2
APPLICATION NO. : 15/314712
DATED : December 19, 2017
INVENTOR(S) : Masaaki Kamiya et al.

It is certified that error appears in the above-identified patent and that said Letters Patent is hereby corrected as shown below:

In the Claims

Column 8, Line 60, Claim 5, delete "claim 3" and insert -- claim 2 --

Signed and Sealed this
Third Day of April, 2018

Andrei Iancu
*Director of the United States Patent and Trademark Office*